United States Patent

You

[11] Patent Number: 5,877,546
[45] Date of Patent: Mar. 2, 1999

[54] SEMICONDUCTOR PACKAGE WITH TRANSPARENT WINDOW AND FABRICATION METHOD THEREOF

[75] Inventor: Joong Ha You, Choongchungbook-Do, Rep. of Korea

[73] Assignee: LG Semicon Co., Ltd., Cheongju, Rep. of Korea

[21] Appl. No.: 581,957

[22] Filed: Jan. 2, 1996

[51] Int. Cl.⁶ .................................................. H01L 23/02
[52] U.S. Cl. ........................................... 257/680; 257/710
[58] Field of Search ................................... 257/434, 680, 257/704, 710, 676, 707, 709

[56] References Cited

U.S. PATENT DOCUMENTS

| | | | |
|---|---|---|---|
| 4,760,440 | 7/1988 | Bigler | 257/680 |
| 4,961,106 | 10/1990 | Butt | 257/710 |
| 5,550,398 | 8/1996 | Kocian et al. | 257/434 |

FOREIGN PATENT DOCUMENTS

| | | | |
|---|---|---|---|
| 361194749 A | 8/1986 | Japan . | |
| 2-142165 | 5/1990 | Japan | 257/434 |
| 2-150073 | 6/1990 | Japan | 257/434 |
| 2-250374 | 10/1990 | Japan | 257/434 |
| 3-124062 | 5/1991 | Japan | 257/434 |
| 3-195065 | 8/1991 | Japan | 257/434 |
| 403292768 A | 12/1991 | Japan . | |
| 405109914 A | 4/1993 | Japan . | |
| 6-53454 | 2/1994 | Japan | 257/434 |

Primary Examiner—A. Zarabian
Attorney, Agent, or Firm—Fleshner & Kim

[57] ABSTRACT

An improved semiconductor package with a transparent window and a fabrication method thereof having a transparent window formed at a central portion of a semiconductor apparatus not providing a ceramic upper plate and adhesive, which includes a semiconductor chip; a ceramic plate for receiving the semiconductor chip; a lead frame sealed with the ceramic plate, the lead frame being angled and curved; a transparent window mounted on the upper portion of the lead frame; and a sealant provided at the ceramic plate and a side surface of the transparent window.

12 Claims, 4 Drawing Sheets

SEMICONDUCTOR PACKAGE WITH TRANSPARENT WINDOW AND FABRICATION METHOD THEREOF

BACKGROUND OF THE INVENTION

1. Field of the Invention

The present invention relates to a semiconductor package with a transparent window and a fabrication method thereof, and particularly to an improved semiconductor package with a transparent window and a fabrication method thereof having a transparent window formed at a central portion of a semiconductor apparatus.

2. Description of the Conventional Art

Recently, it is required that semiconductor package material should have a low dielectric rate, a high heat conductivity, and a desired thermal expansion coefficient similar to that of semiconductor device as electronic parts having an extensive storing capability, a high speed operation, and a low fabrication cost in the industry.

In this trend, a semiconductor package with a window has been developed so as to overcome the problems encountered in the prior art. FIG. 1 shows a ceramic dual-in-line package (CERDIP) of a charge coupled device (CCD). As shown therein, the ceramic package with a transparent window is directed to attaching a semiconductor chip 1 after applying a ceramic sealant 6 to a ceramic lower plate 2, mounting a lead frame 4 thereon, coating a die sealant 3 at one side of a central portion of the ceramic lower plate 2. In addition, the semiconductor chip 1 and the lead frame 4 are adhered by a conductive wire 8, and a transparent window 10 is sealed by a transparent window sealant 7.

In more detail, as shown in FIG. 2, the conventional ceramic package is directed to applying a ceramic plate sealant 6 on the ceramic lower plate 2, and mounting the lead frame 4 thereon. In addition, the ceramic upper plate 5 o which one lower side is provided with the ceramic plate sealant 6 is mounted on the lead frame 4, and is heat-treated, so that the ceramic plate sealant 4 is molten.

Meanwhile, the die sealant 3 is coated on a certain central portion of the ceramic lower plate 2, and the semiconductor chip 1 is mounted thereon, and is heat-treated.

Thereafter, the semiconductor chip 1 and the inner leads 9 of the lead frame 4 are bonded using a wire. In addition, the transparent window 10 of which one side is provided with the transparent window sealant 7 is mounted on the ceramic upper plate 5, and is heat-treated so that the transparent window sealant 7 is molten and is sealingly attached to the upper portion of the ceramic upper plate 5.

Thereafter, the lead frame 4 is trimmed, and the fabrication of the semiconductor package is completed.

However, the conventional ceramic type semiconductor package and a fabrication method thereof has the following problems.

Firstly, since a ceramic upper plate and a ceramic plate sealant coated on the upper portion of the ceramic upper plate should be additionally provided, additional fabrication cost with respect thereto is disadvantageously necessary, and fabrication processes are complex.

Secondly, since a transparent window should be provided at an additional ceramic upper plate, it is impossible to achieve a desired sealant effect between the ceramic plate and the transparent window sealant.

SUMMARY OF THE INVENTION

Accordingly, it is an object of the present invention to provide a semiconductor package with a transparent window and a fabrication method thereof, which overcome the problems encountered in a conventional semiconductor package with a transparent window and a fabrication method thereof.

It is another object of the present invention to provide an improved semiconductor package with a transparent window and a fabrication method thereof having a transparent window formed at a central portion of a semiconductor apparatus.

To achieve the above objects, there is provided a semiconductor package with a transparent window, which includes a semiconductor chip; a ceramic plate for receiving the semiconductor chip; a lead frame sealed with the ceramic plate, the lead frame being angled and curved; a transparent window mounted on the upper portion of the lead frame; and a sealant provided at the ceramic plate and a side surface of the transparent window.

To achieve the above objects, there is provided a semiconductor package fabrication method with a transparent window, which includes the steps of a first step which provides a step-shaped curved ceramic plate; a second step which provides a ceramic plate sealant on the upper portion of the ceramic plate; a third step which mounts a lead frame on the upper portion of the ceramic plate sealant; a fourth step which heat-treats the ceramic plate and the lead frame at a high temperature; a fifth step which coats a die sealant on the ceramic plate; a sixth step which mounts a semiconductor chip on the doe sealant; a seventh step which electrically bonds pads of the semiconductor chip and inner leads of the lead frame by a wire; an eighth step which mounts the transparent window having a transparent window sealant on the lead frame; a ninth step which heat-treats the head frame and the transparent window at a high temperature; and a tenth step which trims the lead frame.

DETAILED DESCRIPTION OF THE INVENTION

Figure 1:
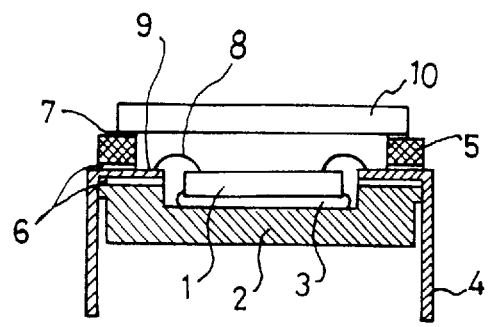
FIG. 1 is a cross-sectional view of a conventional ceramic type semiconductor package.
Figure 2:
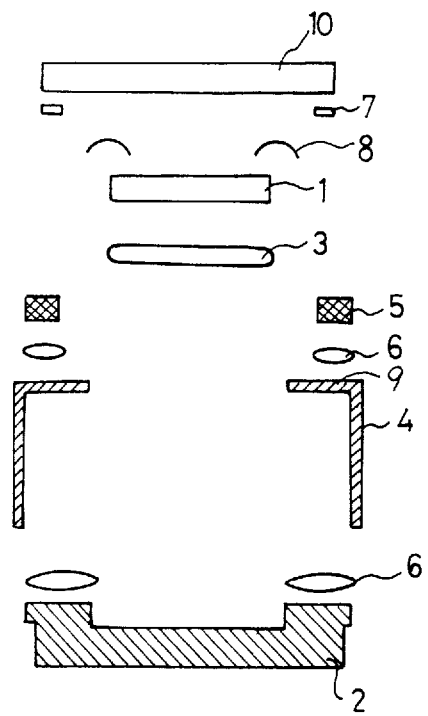
FIG. 2 is an exploded cross-sectional view of FIG. 1.
Figure 3:
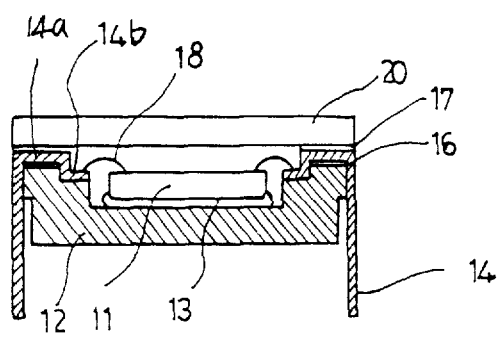
FIG. 3 is a cross-sectional view of a semiconductor package of according to the present invention.
Figure 4:
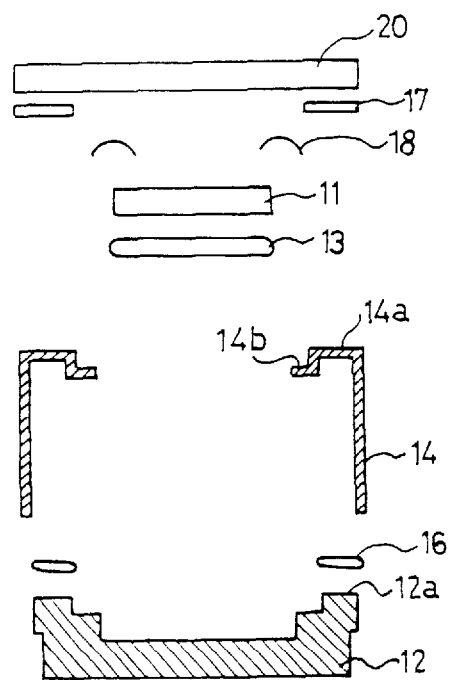
FIG. 4 is an exploded cross-sectional view of a FIG. 3 according to the present invention.

FIGS. 3 and 4 show a semiconductor package according to the present invention. As shown therein, the ceramic type semiconductor package is directed to providing a step-shaped curved ceramic plate 12 to a certain die (not shown). In addition, a ceramic plate sealant 16 is provided on an upper portion 2a of the ceramic plate 12. A lead frame 14 is mounted on the upper portion 12a of the ceramic plate 12 provided with the ceramic plate sealant 16. In addition, an inner leads 14a of the lead frame 14 are curved. In this regard, the reasons with respect thereto are explained in a process of attaching a transparent window which will be explained after with respect to FIGS. 6A and 6B and FIGS. 7A and 7B.

Meanwhile, the ceramic plate 12 and the lead frame 14 are heat-treated at a high temperature, and the ceramic sealant 16 is molted, and a desired sealing effect can be achieved between the ceramic plate 12 and the lead frame 14. Thereafter, a die sealant 13 is coated on a central portion of the ceramic plate 12 of the sealed semiconductor package to have a certain thickness as shown in FIG. 3. In addition, after mounting the semiconductor chip 11 on the upper portion of the die sealant 13, the die sealant 13 is heat-treated. That is, the semiconductor chip 11, as shown in FIG. 5, is positioned at a central portion of the ceramic plate 12.

Figure 5:
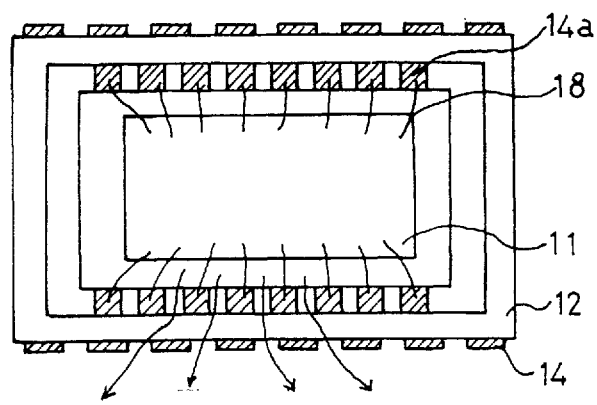
FIG. 5 is a plan view of a semiconductor package equipped with a transparent window according to the present invention.

The pads of the semiconductor chip 11 and the lead frame 14 are electrically bonded by a wire 17 as shown in FIG. 3 and FIG. 5. In addition, the transparent window 20 having a transparent window sealant 16 is provided on one surface thereof is placed on a certain portion on which the lead frame 14 and the ceramic sealant 16 are provided, and is heat-treated at a high temperature, so that the transparent window 20 is attached thereto. Here, when the leaf frame 14 and the transparent window 20 are disposed to have the same width, it is easier to seal. After sealing the semiconductor chip 11, the lead frame 14 is trimmed, and the package is tested, and the semiconductor package fabrication is completed.

The features of the present invention will now be explained with reference to FIGS. 6A and 6B and FIGS. 7A and 7B.

Figure 6A:
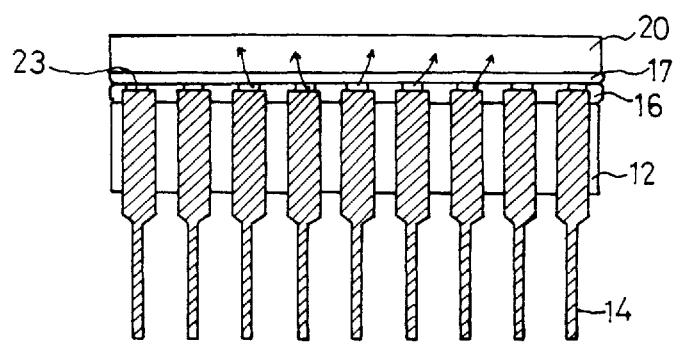
FIG. 6A is a side view of apertures formed on an upper portion of a lead frame according to the present invention.

To begin with, as shown in FIG. 6A, when the transparent window 20 having the transparent window sealant 17 at the inner leads 14a of the lead frame 14 (refer to FIG. 4) is mounted, there are formed a plurality of apertures for discharging air from the interior of the semiconductor package due to an angled and curved section 14b formed on the upper end of the inner leads 14a of the lead frame 14 and the transparent window sealant 17 which crosses the inner leads 14a (refer to FIG. 4). The air within the interior of the semiconductor package is discharged in the arrow direction as shown in FIG. 6A.

Figure 6B:
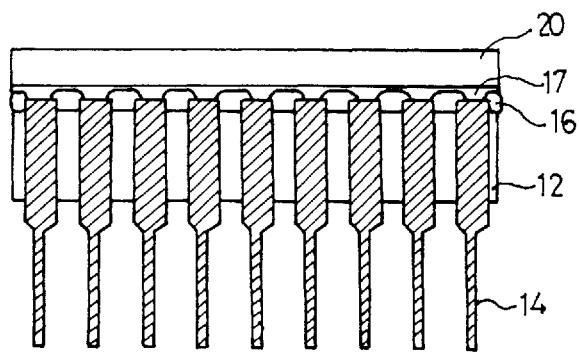
FIG. 6B is a side view of apertures formed on an upper portion of a lead frame after a transparent window is attached to the lead frame according to the present invention.

Meanwhile, FIG. 6B shows apertures formed on an upper portion of a lead frame after a transparent window is attached to the lead frame according to the present invention. As shown therein, the transparent sealant 17 formed with epoxy is heat-treated and is attached to the inner leads 14a of the lead frame 14. Here, when air discharge is completed from the semiconductor package to the outside thereof, the apertures 23 of FIG. 6A are blocked and filled with the transparent sealant 17. Therefore, the interior of the package becomes vacuum.

Figure 7A:
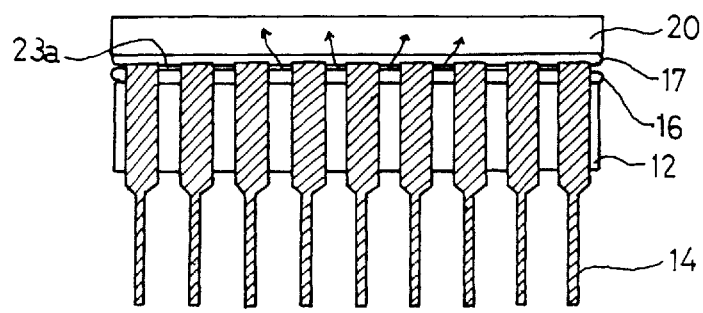
FIG. 7A is a side view of apertures formed on a side surface of a lead frame according to the present invention.

FIG. 7A shows apertures formed on a side surface of a lead frame according to the present invention. As shown therein, a plurality or air apertures 23a are formed between the lead frame 14 attached to the ceramic plate sealant 16 and the transparent sealant 17. That is, the air apertures 23a, as shown therein, are formed because the transparent window sealant 17 cross the ceramic plate sealant 16 between the spaced-apart lead frames 16. Here, the air apertures are directed to discharging air from the interior of the package to the outside thereof. The air discharge is conducted in the arrow direction. Here, the size of the air apertures 23a can be adjusted by changing the arrangement of the transparent window sealant 17 and the ceramic plate sealant 16.

Figure 7B:
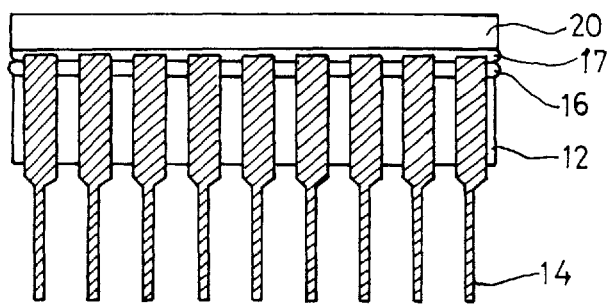
FIG. 7B is a side view of apertures formed on a side surface of a lead frame after a transparent window is attached to the leaf frame according to the present invention.

FIG. 7B shows apertures formed on a side surface of a lead frame after a transparent window is attached to the leaf frame according to the present invention. As shown therein, the transparent window sealant 17 formed with epoxy and the ceramic sealant formed with glass epoxy are heat-treated at a high temperature and are molten and attached to the upper and lower surfaces of the inner leaders of the lead frame 14. Here, the air apertures 23a as shown in FIG. 7A are filled with the transparent window sealant 17 as the air within the package is discharged to the outside thereof, so that the interior of the semiconductor package remains vacuum.

As described above, the semiconductor package with a transparent window and a fabrication method thereof according to the present invention is directed to reducing material cost because a ceramic sealant is used so as to seal the transparent window and the ceramic upper plate.

In addition, the present invention is directed to increasing sealing effects by widening the sealing surfaces of the transparent window, the lead frame, and the ceramic plate sealant, so that antimoisture, and antitemperature of the product are increased.

Although the preferred embodiments of the present invention have been disclosed for illustrative purposes, those skilled in the art will appreciate that various modifications, additions and substitutions are possible, without departing from the scope and spirit of the invention as described in the accompanying claims.

What is claimed is:
1. A chip package, comprising:
  a mounting plate;
  a chip having a plurality of bond pads attached to the mounting plate;
  a plurality of leads, wherein the leads are coupled to bond pads of the chip;
  a first adhesive portion attaching bottom surfaces of the plurality of leads to a peripheral portion of the mounting plate;
  a transparent window; and
  a second adhesive portion attaching a peripheral edge of the transparent window to upper surfaces of the leads, wherein the first and second adhesive portions are applied to the leads such that apertures are formed on each of the leads, and wherein the apertures allow gas to flow between an interior and an exterior of the chip package, and wherein the apertures are sealable.

2. The package of claim 1, wherein the transparent window comprises a flat window.

3. The package of claim 1, wherein exterior dimensions of the transparent window match exterior dimensions of the mounting plate.

4. The package of claim 1, wherein the apertures are formed between each of the leads, the first adhesive portion, and the second adhesive portion.

5. The package of claim 1, wherein the apertures are formed between upper surfaces of the leads and the second adhesive portion.

6. The package of claim 1, wherein the apertures are formed between side surfaces of the leads.

7. A chip package, comprising:
  a mounting plate;
  a chip having a plurality of bond pads attached to the mounting plate;

a plurality of leads, wherein the leads are coupled to bond pads of the chip;

a transparent window; and means for attaching the leads and the transparent window to the mounting plate such that apertures formed between the window and the mounting plate allow gas to flow between an interior and an exterior of the chip package, and wherein the apertures are sealable.

8. The semiconductor package of claim 7, wherein the leads are interposed between the mounting plate and the transparent window.

9. The semiconductor package of claim 7, wherein the attaching means comprises an adhesive interposed between the mounting plate and the window.

10. The semiconductor package of claim 9, wherein apertures are formed between the adhesive and upper surfaces of the leads.

11. The semiconductor package of claim 9, wherein apertures are formed in the adhesive between surfaces of the leads.

12. The semiconductor package of claim 7, wherein the attaching means comprises a first adhesive portion and a second adhesive portion, and wherein apertures are formed between the first and second adhesive portions.

\* \* \* \* \*